United States Patent
Visconti et al.

(10) Patent No.: US 8,451,662 B2
(45) Date of Patent: May 28, 2013

(54) READING MEMORY CELL HISTORY DURING PROGRAM OPERATION FOR ADAPTIVE PROGRAMMING

(75) Inventors: Angelo Visconti, Appiano Gentile (IT); Mattia Robustelli, Milan (IT); Silvia Beltrami, Almenno S. Barolomeo (IT); Laura Czeppel, Milan (IT); Massimo Bertuccio, San Donato Milanese (IT)

(73) Assignee: Micron Technology, Inc., Boise, ID (US)

( * ) Notice: Subject to any disclaimer, the term of this patent is extended or adjusted under 35 U.S.C. 154(b) by 148 days.

(21) Appl. No.: 13/040,200

(22) Filed: Mar. 3, 2011

(65) Prior Publication Data

US 2012/0224430 A1    Sep. 6, 2012

(51) Int. Cl.
*G11C 16/04* (2006.01)
*G11C 16/06* (2006.01)

(52) U.S. Cl.
USPC ............ 365/185.22; 365/185.19; 365/185.21; 365/185.28

(58) Field of Classification Search
USPC .................................................. 365/185.22
See application file for complete search history.

(56) References Cited

U.S. PATENT DOCUMENTS

| | | | |
|---|---|---|---|
| 6,917,543 B2 * | 7/2005 | Sato | 365/185.22 |
| 7,038,950 B1 * | 5/2006 | Hamilton et al. | 365/185.28 |
| 7,339,834 B2 * | 3/2008 | Lutze | 365/185.28 |
| 7,580,290 B2 * | 8/2009 | Fong et al. | 365/185.19 |
| 7,692,970 B2 * | 4/2010 | Park et al. | 365/185.22 |
| 8,195,899 B2 * | 6/2012 | Chen et al. | 711/156 |
| 8,223,554 B2 * | 7/2012 | Hemink | 365/185.21 |
| 2007/0253249 A1 * | 11/2007 | Kang et al. | 365/185.03 |
| 2010/0046303 A1 * | 2/2010 | Mihnea et al. | 365/185.22 |
| 2010/0135082 A1 * | 6/2010 | Bathul et al. | 365/185.19 |
| 2010/0199150 A1 * | 8/2010 | Shalvi et al. | 714/773 |
| 2012/0039125 A1 * | 2/2012 | Cernea | 365/185.03 |
| 2012/0239991 A1 * | 9/2012 | Melik-Martirosian | 714/708 |

OTHER PUBLICATIONS

Cho, et al, "A Dual-Mode NAND Flash Memory: 1-Gb Multilevel and High-Performance 512-Mb Single-Level Modes," IEEE Journal of Solid-State Circuits, vol. 36, No. 11, Nov. 2001, 3 pages.

* cited by examiner

*Primary Examiner* — Son Mai
(74) *Attorney, Agent, or Firm* — Knobbe, Martens, Olson & Bear LLP (57) ABSTRACT

Subject matter disclosed herein relates to a memory device, and more particularly to write performance of a memory device.

22 Claims, 6 Drawing Sheets

READING MEMORY CELL HISTORY DURING PROGRAM OPERATION FOR ADAPTIVE PROGRAMMING

BACKGROUND

1. Field

Subject matter disclosed herein relates to a memory device, and more particularly to write performance of a memory device.

2. Information

Memory devices are employed in many types of electronic devices, such as computers, cell phones, PDA's, data loggers, and navigational equipment, just to name a few examples. Among such electronic devices, various types of nonvolatile memory devices may be employed, such as NAND or NOR flash memories, and phase-change memory, just to name a few examples.

A NAND flash memory cell may transition from one state to another state by applying a bias signal to a control gate of the memory cell. Applying such a bias signal may result in charging a floating gate disposed between the control gate and a channel of the memory cell. Consequently, the amount of such charge on the floating gate may determine whether the memory cell is conductive above a particular threshold voltage applied to the control gate during a process to read the memory cell. However, a memory cell's response to a particular bias signal may change over time due to physical changes within the memory cell that may result from aging and usage, for example. Thus, it may be difficult to select proper bias signals to program such memory cells as the memory cells physically change over time.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

Embodiments described herein include processes and/or electronic architecture involving modifying memory cell program conditions of a memory device in response to reading flag cells that store wear information of the memory device. As a memory device ages, "optimal" program conditions for writing to the memory device may change or evolve. An ability to modify such program conditions, such as voltage amplitude, pulse width, step size of program pulses, for example, may lead to improved program speed and/or reliability of the aging memory device. Accordingly, wear information, comprising information regarding aging and/or usage of the memory device or portions thereof, may provide a metric by which effects of the aging memory device may be determined or assessed. Herein, wear information will be called use-history information.

Use-history information may comprise counts of program-erase and/or read cycles that a memory device has been subjected to, or other information that may indicate effects of age and wear on a memory device. Other examples of use-history information may include a count of erase pulses involved in successfully erasing a memory block, or memory cells' voltage threshold distribution at a given probability after a first erase pulse, since both the count of erase pulses and the cells' threshold voltage distribution may change after cycling. In an implementation, a memory device may comprise a memory array partitioned to include data cells and flag cells. Flag cells may comprise memory cells used to store use-history information of the memory device while data cells may comprise memory cells used to store user data. Such user data, for example, may comprise data programmed by a processor executing an application. In comparison, use-history information stored in flag cells may be generated by a memory controller of the memory device, as described below. An array of memory cells in a memory device may be arranged so that a plurality of data cells shares a common wordline with a plurality of flag cells. Thus, a process of reading data cells on a wordline may involve concurrently reading flag cells on the same wordline. Such concurrent reading of data cells and flag cells may provide an opportunity to read use-history information of the data cells without a need for an additional process to read the flag cells. In a counter-example, if use-history information of data cells were stored in a portion of a memory array that did not share a common wordline, then reading the use-history information may involve a read process separate from (and in addition to) the process to read the data cells. Reducing a number of read processes, as may be accomplished in the embodiments described herein, may lead to faster-performing memory devices.

In a particular embodiment, as mentioned above, flag cells that share a common wordline with data cells may be read concurrently with reading the data cells during a program-verify (PV) process. Parameters of such a PV process may be modified based, at least in part, on use-history information of the data cells stored in flag cells. Accordingly, parameters of the PV process may be dynamically modified during the PV process, as described in detail below. For example, such dynamic modification may allow program pulse parameters to be modified during a program process. Such parameters may include program pulse amplitude, width, step size, and so on. A benefit of an ability to dynamically modify a PV process, as described herein, is that an extra process to read stored use-history information may be avoided, for example, thus improving memory device reliability without increasing operating speed of the memory device. Another benefit of an ability to dynamically modify parameters of a PV process is that values of PV parameters established at the beginning of life for a memory device need not be selected as a compromise between "optimal" values of a new memory device and "optimal" values of the aged memory device. For example, a memory designer need not be concerned with selecting program pulse parameters that are merely acceptable during a whole life of a memory device. Instead, program pulse parameters may be initially selected to be most desirable for the new memory device because such program pulse parameters may be modified as the memory device ages.

Thus, in an embodiment, a method of programming a memory device may comprise storing use-history information regarding a memory array of the memory device in flag cells of the memory array. Such a first portion of memory cells may be read during a program-verify process to program data cells of the memory array, wherein the flag cells and the data cells may be responsive to or share the same wordline. In response to reading such use-history information, program pulse parameters of the program-verify process may be modified based, at least in part, on the read use-history information. In an implementation, such a program-verify process may comprise an incremental step pulse programming (ISPP) process, wherein a plurality of program pulses alternate with a plurality of verify processes, as discussed below. In another implementation, use-history information stored in flag cells may be updated in response to erasing data cells. In yet another implementation, flag cells may be programmed above a threshold voltage higher than that of programmed data cells. Though claimed subject matter is not so limited, a memory array that includes such flag and data cells may comprise a NAND block array.

Figure 1:
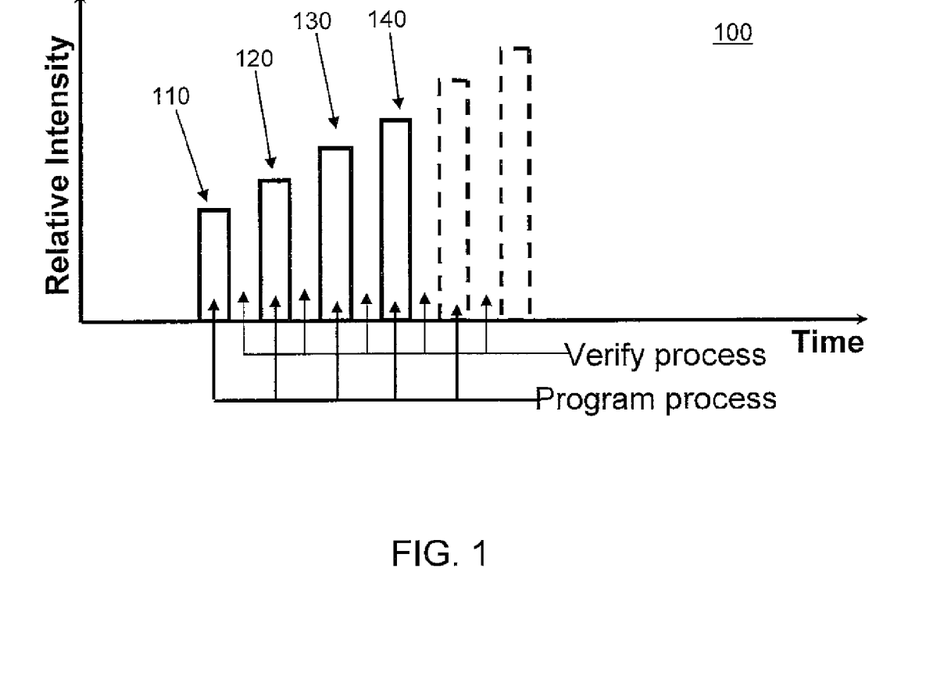
FIG. 1 is a plot of characteristics of program step pulses, according to an embodiment.

FIG. 1 is a plot of characteristics of a program-verify (PV) bias signal 100 comprising program step pulses, according to an embodiment. A process of writing to a NAND memory cell, which may use PV bias signal 100, may also comprise a process to verify that a particular bit was successfully written to the memory cell of a NAND block array. For example, program step pulses and verify processes may be alternately performed during a PV process. In a particular example, a first program pulse may be applied to a memory cell to program the memory cell to a "0" state. A verify process may follow the first program pulse to determine whether or not the memory cell was successfully programmed to a "0" state. If not, then a second program pulse having a higher magnitude than that of the first program pulse may be applied to the memory cell. A verify process may then be repeated, and so on. Such a memory cell may comprise a single level cell or a multi-level cell, for example. In one implementation, an ISPP process may be used, wherein a magnitude of a program pulse applied to a control gate of a particular memory cell may be sequentially increased until the particular memory cell is determined to be successfully programmed. As discussed in detail below, parameters of a PV bias signal, such as program pulse width, peak amplitude, step size between consecutive program pulses, and so on may be modified based, at least in part, on use-history information of the particular memory cell.

In detail, PV bias signal 100 may comprise one or more individual program pulses applied to a memory cell until the memory cell transitions to a programmed state. PV bias signal 100 may comprise a voltage signal applied to a control gate (e.g., a wordline) of memory cells of a NAND block array, for example. In particular, subsequent program pulses may have a greater peak amplitude than a previous program pulse. In one implementation, a series of such program pulses may comprise a waveform having individual peak amplitudes that sequentially increase from one pulse to the next. Such an implementation may address an issue of variability of physical and/or electrical characteristics of a plurality of memory cells in a NAND device, for example. As shown in FIG. 1, a first program pulse 110 may be followed by a second program pulse 120 having a peak amplitude higher than that of the first program pulse. According to an ISPP process, and as mentioned above, a verify process may be performed between consecutive program pulses of PV bias signal 100. Such a verify process may be used to determine whether programming a memory cell using a preceding program pulse was successful or not. For example, first program pulse 110 applied to a memory cell may be followed by a verify process to determine whether the memory cell was successfully programmed by program pulse 110. If so, then PV bias signal 100 may no longer be applied to the memory cell (e.g., subsequent program pulses 120, 130, 140, and so on need not be applied to the memory cell). However, if the memory cell was not successfully programmed, then second program pulse 120, having a peak amplitude higher than that of first program pulse 110 may be applied to the memory cell. As before, second program pulse 120 applied to the memory cell may be followed by a verify process to determine whether the memory cell was successfully programmed by program pulse 120. If so, then PV bias signal 100 may no longer be applied to the memory cell (e.g., subsequent program pulses 130, 140, and so on need not be applied to the memory cell). However, if the memory cell was not successfully programmed, then third program pulse 130, having a peak amplitude higher than that of second program pulse 120 may be applied to the memory cell. Such a process may continue until the program pulse is successfully programmed. Such a PV bias signal 100, of course, may comprise a variety of characteristic shapes and/or configurations, and claimed subject matter is not limited in this respect.

Figure 2:
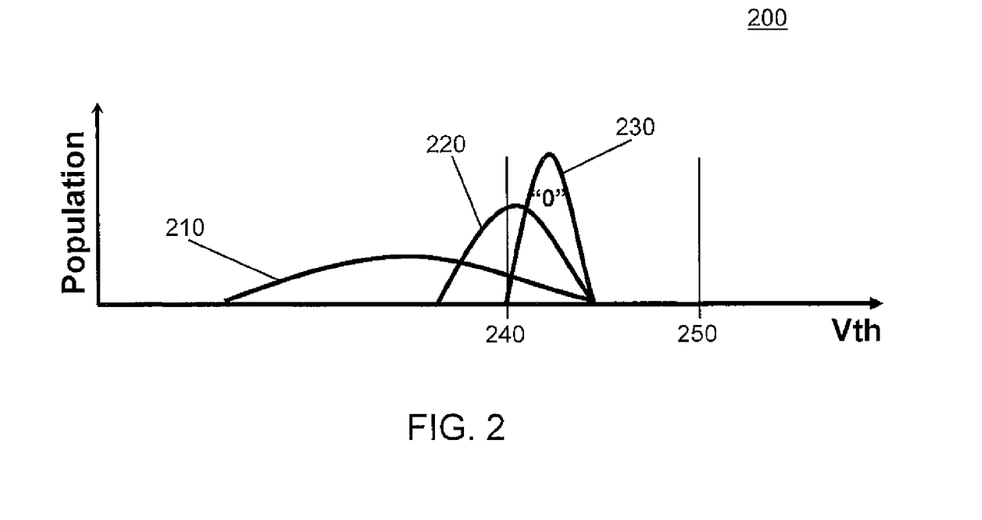
FIG. 2 is a plot showing threshold voltage distributions for a population of memory cells in a memory array, according to an embodiment.

FIG. 2 is a plot showing threshold voltage distributions 200 for a population of memory cells programmed by the application of PV bias signal 100, shown in FIG. 1, for example, according to an embodiment. Such distributions may arise from physical variations of memory cells in an array due to usage (e.g., program-erase cycles), fabrication, and/or location on a semiconductor wafer, for example. To elaborate, variations in fabrication conditions from lot to lot and/or from region to region on a semiconductor wafer, for example, may lead to variations in characteristics and/or physical parameters of memory cells. Of course, such variations may result from any of a number of situations or conditions. For another example, physical position of a memory cell in a circuit may affect and/or modify physical parameters of the memory cell. In particular, capacitance, magnetic and electric fields, and/or heat may contribute to such variations, though claimed subject matter is not limited in this respect. Because one portion of memory cells in a memory array may behave differently from another portion of memory cells, a particular bias signal may affect some memory cells differently from other memory cells. Accordingly, one portion of memory cells in an array may behave differently from another portion of memory cells in response to an applied bias signal having a particular magnitude. For example, a particular magnitude of a program pulse applied to one memory cell may result in the memory cell being programmed to a "0" state, while the same program pulse applied to another memory cell may result in the memory cell failing to be programmed to a "0" state (so that another, higher magnitude program pulse may be applied if the memory cell is to finally be programmed to such a "0" state, for example).

Variations of properties of a population of memory cells in an array, as discussed above, may lead to a distribution 210 of threshold voltages of the memory cells after receiving a first program pulse 110. Such a relatively broad distribution may be narrowed by applying subsequent program pulses 120, 130, and so on of PV bias signal 100. For example, applying second and third program pulses 120 and 130 to the memory cells may lead to a distribution 220 of threshold voltages. Continuing, applying subsequent program pulses 140 and so on to the memory cells may lead to a distribution 230 of threshold voltages. In detail, such program pulses may be applied only to memory cells that are determined (e.g., by a verify process performed between program pulses, as described above) to have a threshold voltage below a particular value 240, herein called a program-verify (PV) level. In this fashion, program pulses having increasingly large magnitudes may be sequentially applied to memory cells until the memory cells finally have threshold voltages at or above PV level 240. In an implementation, PV level 240 may be below a $V_{read}$ level 250, which is described in detail below.

Figure 3:
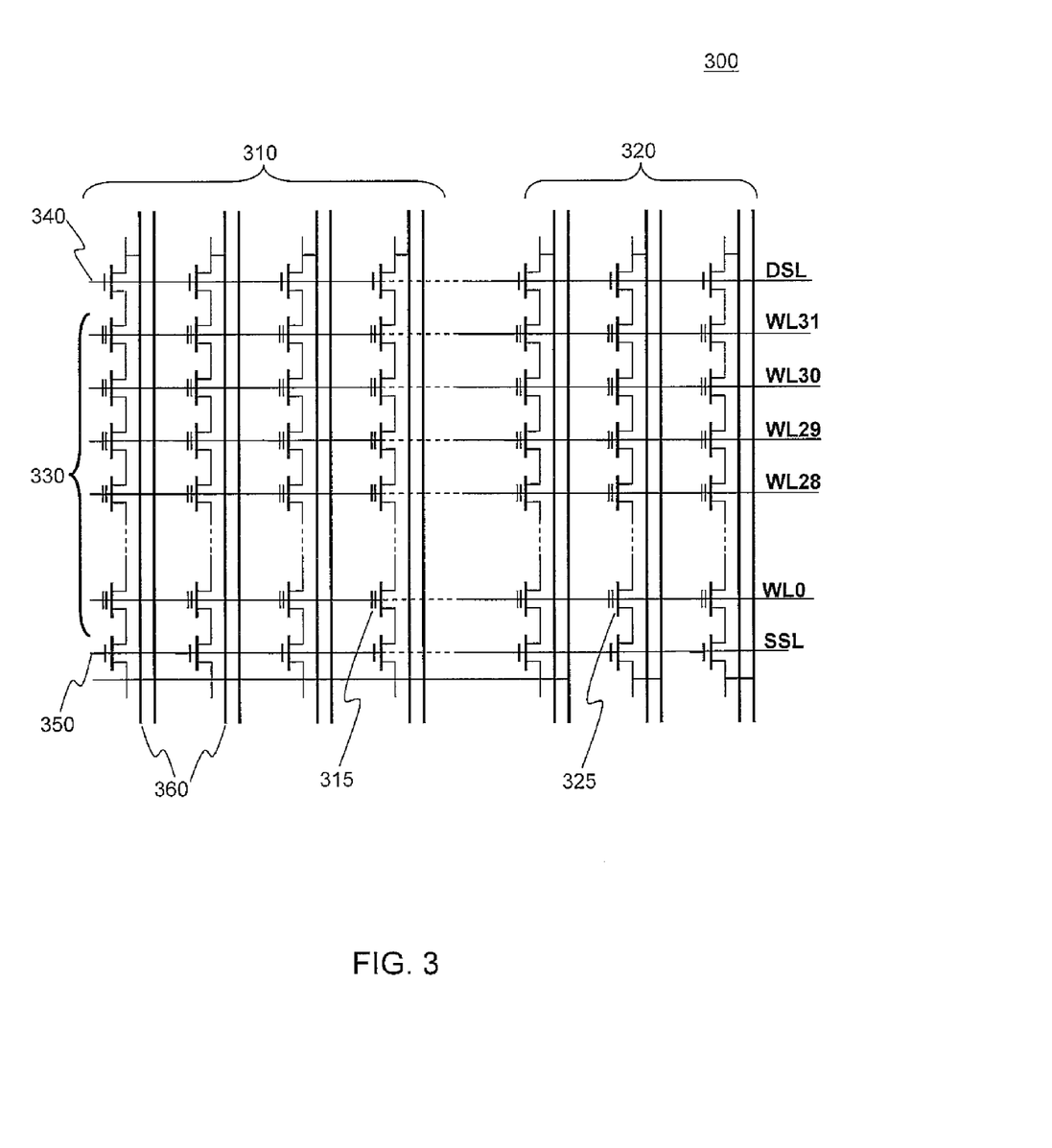
FIG. 3 is a schematic diagram of a NAND block memory array, according to an embodiment.

FIG. 3 is a schematic diagram of an array portion 300 of a NAND block memory array, according to an embodiment. Array portion 300 may be partitioned to comprise a data cell area 310 and a flag cell area 320. Data cell area 310 may include a plurality of data cells 315 to store data that may be generated by a processor (e.g., processing unit 920 shown in FIG. 9) executing an application, for example. Accordingly, such data cells may be user-accessible via read, write, and/or erase operations. In contrast, flag cell area 320 may include a plurality of flag cells 325 to store use-history information, and such flag cells need not be user-accessible, though claimed subject matter is not so limited. Instead, as explained in detail below, flag cells 325 may be accessed by a memory controller, such as memory controller 915 shown in FIG. 9, for example. Both data cells and flag cells may comprise physically similar NAND memory cells. However, data cells and flag cells may be distinguished from one another in that NAND memory cells located in data cell area 310 may operate as data cells whereas NAND memory cells located in flag cell area 320 may operate as flag cells. In an implementation, a plurality of data cells located on a particular wordline among a plurality of wordlines 330 may be associated with corresponding flag cells that are co-located on the same particular wordline. For example, sixty data cells and four flag cells may be co-located on wordline WL29 in FIG. 3, though such particular numbers of memory cells are merely examples, and claimed subject matter is not so limited. Accordingly, in an implementation, a process of reading data cells 315 on a particular wordline may also include a concurrent reading of flag cells 325 on the same wordline. In such a fashion, as explained above, use-history information stored in flag cells 325 need not be read in a separate, additional, time-consuming process.

Array portion 300 may also include bitlines 360 that span across multiple data cells and/or flag cells in columns of the cell array. A drain select line (DSL) 340 or a source select line (SSL) 350 may be used to select among such bitline columns. A plurality of wordlines 330 may individually comprise data cells 315 and flag cells 325, as described above. For example, wordlines 330 may comprise wordlines WL0 through WL31, as shown in FIG. 3.

As described above, array portion 300 may be partitioned to comprise a data cell area 310 and a flag cell area 320. Prior to such partitioning, array portion 300 may comprise an array of substantially identical NAND cells. In an implementation, partitioning such an array need not involve any physical changes, such as changes to a circuit layout or architecture for example. Instead, partitioning may be implemented by performing read/write techniques for one portion (e.g., data cell area 310) of the array that may be different from read/write techniques for another portion (e.g., flag cell area 320) of the array. For example, 32K NAND cells may be located on a particular wordline. A memory controller, using appropriate addressing, may be adapted to store user data in 31K NAND cells (e.g., data cells 315) and to store use-history information in the remaining 1K NAND cells (e.g., flag cells). In another example, the first 31K NAND cells (e.g., data cells 315) may be programmed using wordline and/or bitline voltages that are different from that used for the remaining 1K NAND cells (e.g., flag cells), as explained in further detail below. In one implementation, a flag cell area 320 may comprise a spare area of a NAND block array, though claimed subject matter is not so limited.

Figure 4:
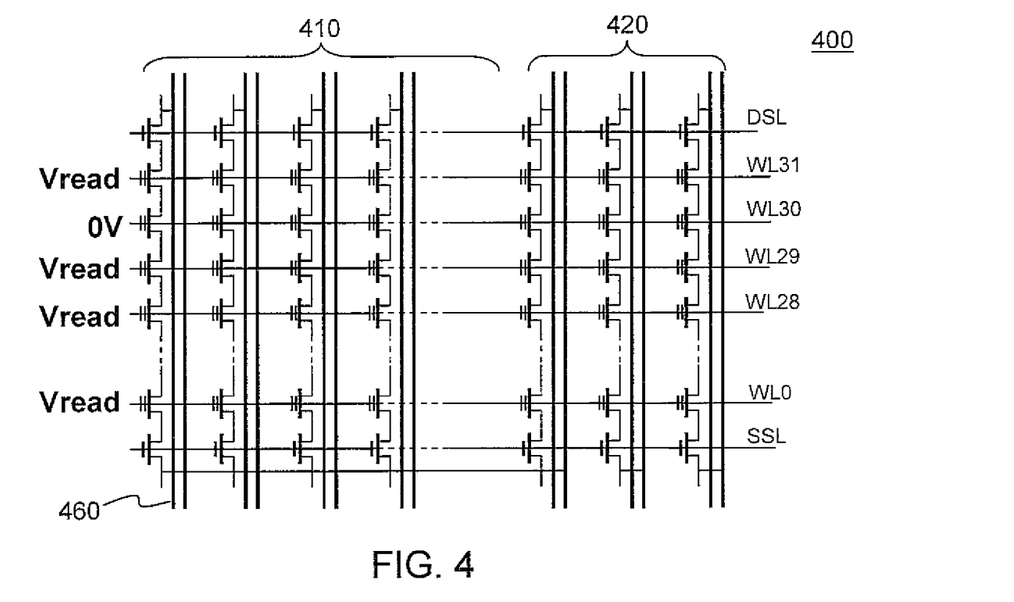
FIG. 4 is a schematic diagram of a NAND block memory array during a read operation, according to an embodiment.

FIG. 4 is a schematic diagram of a NAND block memory array 400 during a read operation, according to an embodiment. A memory controller, for example, may perform such a read operation by applying particular voltage levels to wordlines WL and/or bitlines 460, for example. In the example shown in FIG. 4, a memory controller (e.g., memory controller 915, shown in FIG. 9) may apply a voltage $V_{read}$ to wordlines WL0 through WL31 except for WL30, which includes NAND cells that have been selected to be read. Applying voltage to a wordline being read (e.g., 0V, as in the example) may provide an opportunity to discriminate between "1" and "0" states of memory cells belonging to a particular wordline. $V_{read}$ applied to unselected wordlines may provide an opportunity to switch on unselected memory cells, regardless of their state. As discussed above, such NAND cells comprise a plurality of data cells in data cell area 410 and a plurality of flag cells in flag cell area 420. Such a process may be repeated to sequentially read remaining wordlines, for example.

Figure 5:
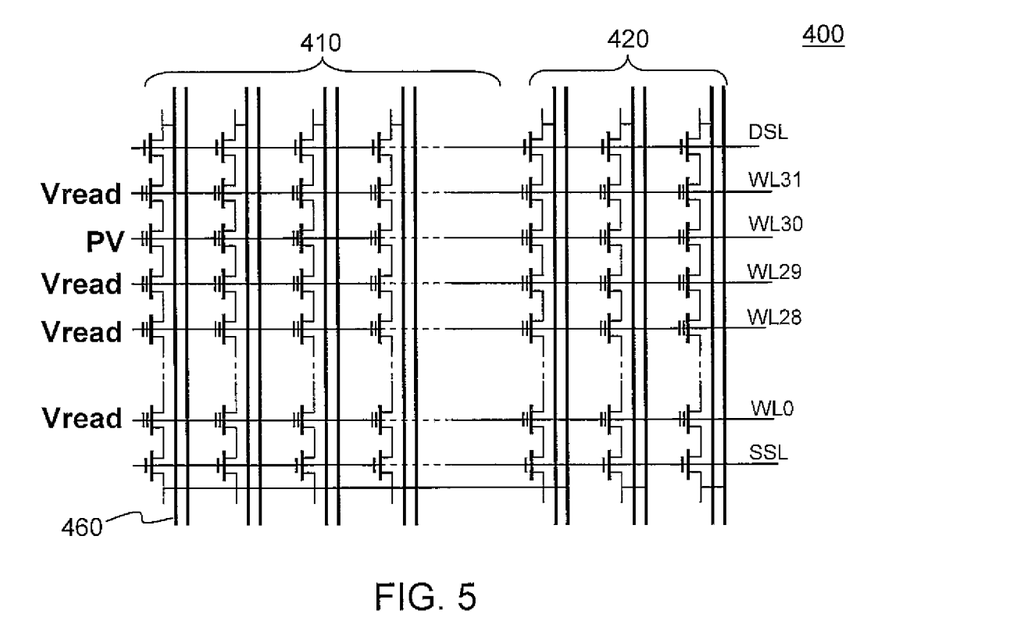
FIG. 5 is a schematic diagram of a NAND block memory array during a program-verify operation, according to an embodiment.

FIG. 5 is a schematic diagram of NAND block memory array 400 during a verify operation, according to an embodiment. A memory controller, for example, may perform such a verify operation by applying particular voltage levels to wordlines WL and/or bitlines 460, for example. In the example shown in FIG. 5, a memory controller may apply a voltage $V_{read}$ to wordlines WL0 through WL31 except for WL30, which includes NAND cells that have been selected to be verified. As discussed above, such NAND cells comprise a plurality of data cells in data cell area 410 and a plurality of flag cells in flag cell area 420. Thus, wordline WL30 may be held at a relatively low voltage (e.g., a voltage PV) compared to voltage $V_{read}$ applied to the remaining wordlines. A purpose of this verify operation may be to read use-history information from flag cells while concurrently verifying data cells that are being programmed. Such a process may be repeated to sequentially verify remaining wordlines, for example. In one implementation, flag cells may have been programmed to a higher threshold voltage than that of data cells. Such a higher threshold voltage may lead to a retention margin for flag cells, which is explained below and shown in FIG. 7, for example.

Figure 6:
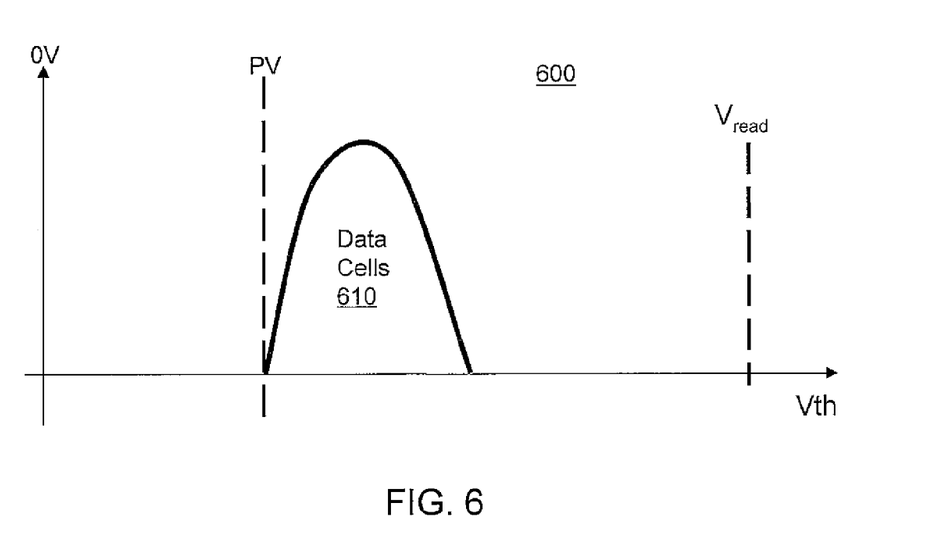
FIG. 6 is a plot showing a threshold voltage distribution for a population of programmed data cells in a memory array, according to an embodiment.
Figure 7:
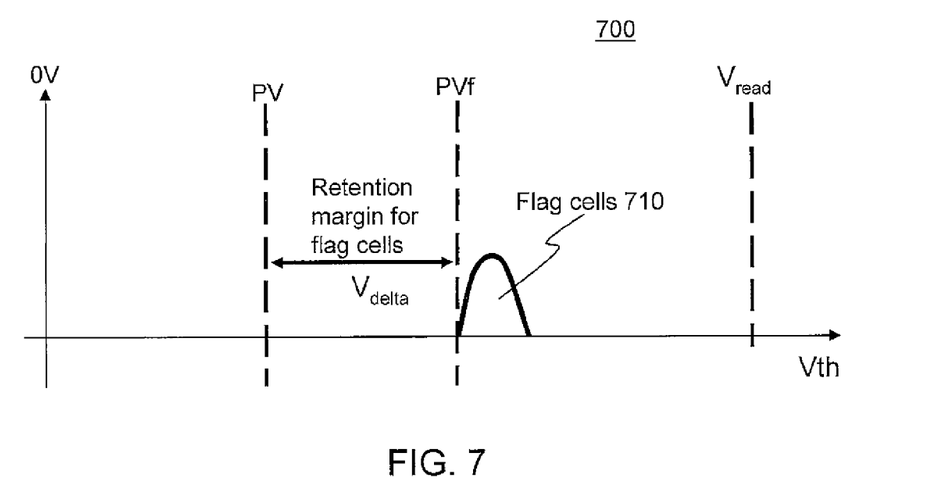
FIG. 7 is a plot showing a threshold voltage distribution for a population of programmed flag cells in a memory array, according to an embodiment.

FIG. 6 is a plot showing a threshold voltage distribution 600 for a population of programmed data cells 610 in a memory array, and FIG. 7 is a plot showing a threshold voltage distribution 700 for a population of programmed flag cells 710 in the memory array, according to an embodiment. Such a distribution of programmed data cells 610 may result from applying PV bias signal 100, shown in FIG. 1, for example, to data cells to be programmed. In other words, programmed data cells 610 may have been programmed by a PV bias signal 100 comprising a series on increasing-magnitude program pulses (e.g., step pulses), as discussed above. In particular, such programming may lead to programmed data cells 610 having a threshold voltage equal to or greater than a program-verify voltage PV. In an implementation, voltage PV may be substantially lower than $V_{read}$, introduced above in FIGS. 4 and 5. In contrast, a distribution of programmed flag cells 710 may result from applying a bias signal having a relatively larger magnitude compared to PV bias signal 100, for example, to data cells 610. In particular, programmed flag cells 710 may have a threshold voltage equal to or greater than a program-verify voltage PVf, which may be greater than voltage PV by an amount $V_{delta}$. In an implementation, $V_{delta}$ may comprise a retention margin to account for a possibility that floating gates of flag cells may lose charge over time, resulting in lowered threshold voltages. $V_{delta}$ may also comprise a margin for read noise. For example, returning to FIGS. 4 and 5, bias for a read operation and a verify operation are similar, with the verify operation differing from the read operation for the bias applied to the selected wordline (e.g., PV level instead of a lower voltage). Since a reliability margin for retention may be needed between the program level and the read level for memory cells, such cells may be programmed well above this level. While for data cells, being a read level lower (e.g., zero volts), the PV programming level may already comprise a retention margin, for example.

In an embodiment, a memory controller may comprise one or more counters to count events pertaining to data cells of an array. Such events may comprise erase cycles, program-verify cycles, and/or number of pulses used in an erase or program operation, just to name a few examples. A memory controller may use event counts to generate use-history information regarding the data cells. In one implementation, particular use-history information may pertain to all data cells on a particular wordline. In another implementation, particular use-history information may pertain to all data cells in a page or block of a memory device. For example, one page of a memory array may have a different use-history than that of another page. As another example, one wordline of data cells may have a different use-history than that of another wordline of data cells.

From time to time, such use-history information may be written to flag cells on the same wordline used by data cells to which the use-history information pertains. For example, in one implementation, such flag cells may be updated with new use-history information subsequent to a process to erase the data cells. In another implementation, flag cells may be updated with new use-history information subsequent to every ten, hundred, thousand or so such erase processes, just to list a few examples. In yet another implementation, flag cells may be updated with new use-history information subsequent to a generic write operation on the memory array. In still another implementation, flag cells may be updated with new use-history information as a result of the memory controller determining that such use-history information has substantially changed.

In one implementation, use-history information stored in flag cells may comprise a four-bit nibble or an eight bit word, or any other number of bits, for example. A memory controller may comprise a lookup table and/or algorithm to decode read flag cell bits into use-history information that may be used to determine modifications of parameters of program pulses to program data cells. As explained above, such modifications may be performed during program-verify processes. Of course, such details regarding use-history information are merely examples, and claimed subject matter is not so limited.

Figure 8:
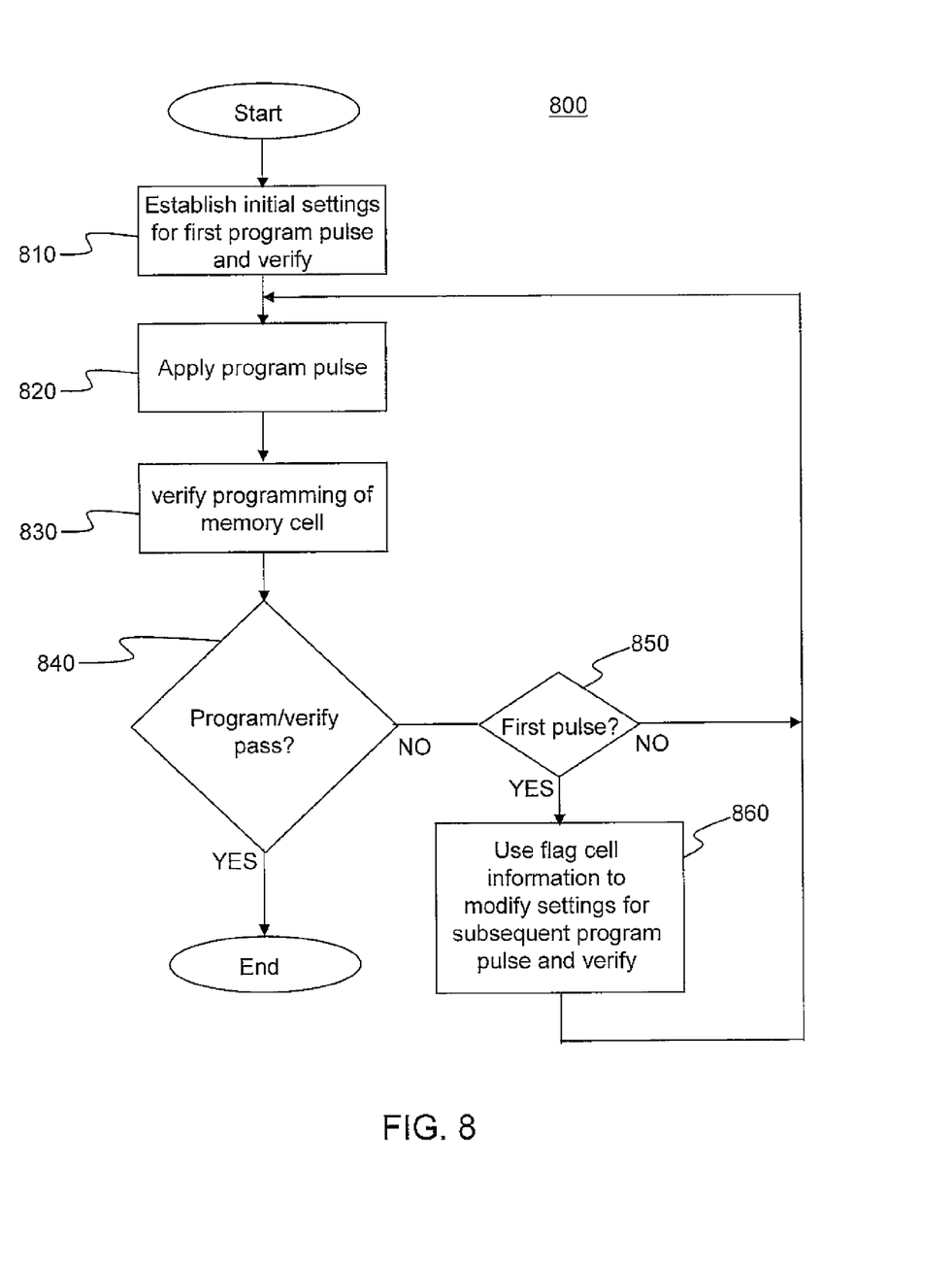
FIG. 8 is a flow diagram of a program-verify process, according to an embodiment.

FIG. 8 is a flow diagram of a program-verify process 800, according to an embodiment. For example, a memory controller may perform process 800 to program a memory cell in response to receiving program instructions from a processor executing a program. Such a memory cell may comprise a NAND cell, such as data cell 315 shown in FIG. 3, for example. At block 810, a memory controller may select parameters for an initial program pulse, such as program pulse 110 shown in FIG. 1. Such parameters may include, but are not limited to, voltage amplitude, pulse width, and voltage amplitude step size for a subsequent program pulse (e.g., program pulse 120). At block 820, the memory controller may apply a program pulse via a wordline to a control gate of the memory cell. Subsequent to applying the first program pulse, the memory controller may verify that the memory cell was correctly programmed in a verify process, as in block 830. As explained above, such a verify process may comprise a process of reading the state of the flag memory cells while verifying whether data cells are programmed. At diamond 840, by reading the state of the memory cell, the memory controller may determine if the memory cell was successfully programmed by the program pulse. If so, then process 800 may be complete. If, however, the memory cell was not successfully programmed by the last-applied program pulse, then process 800 may proceed to diamond 850, where the memory controller may determine whether the most recent program pulse was a first program pulse. If not, then process 800 may return to block 820 where a subsequent program pulse may be applied to the control gate of the memory cell. Such a subsequent program pulse may have a voltage amplitude larger by a step size than the voltage amplitude of the previous program pulse, as explained above. Process 800 may then repeat such program and verify processes as in blocks 820 and 830 until the memory cell is verified to be successfully programmed. On the other hand, if the most recent program pulse was a first program pulse, then process 800 may proceed from diamond 850 to block 860, where use-history information stored in one or more flag cells may be used to modify subsequent program pulses. In particular, such flag cells may share the same wordline as the memory cell being programmed. Further such use-history information may pertain to the memory cell being programmed. Accordingly, based at least in part on the use-history information of the memory cell, it may be desirable to modify one or more parameters of the program pulses used to program the memory cell. For example, use-history information stored in flag cells may indicate that the memory cell to be programmed has experienced more than one-thousand program-verify cycles. In response to such a relatively large number of program-verify cycles, a memory controller may be configured to decrease program pulse step size for subsequent program pulses to be applied to the memory cell. A reason for such a decreased program pulse may be due to the fact that NAND cells tend to accumulate excess trapped charges in the oxide layer of the floating gate after a relatively large number of program-verify cycles, for example. In such a case, a program pulse need not be as large as before (e.g., near the beginning of the memory cell life) to generate a given threshold voltage. Thus, magnitudes of program pulses used to program a relatively old memory cell (e.g., having experienced a relatively large number of program and erase cycles) may be correspondingly reduced. After the memory controller determines modified parameters (if any modification is to occur) of subsequent program pulses, process 800 may return to blocks 820 and 830, where program and verify processes may be repeated until the memory cell is verified to be successfully programmed.

Figure 9:
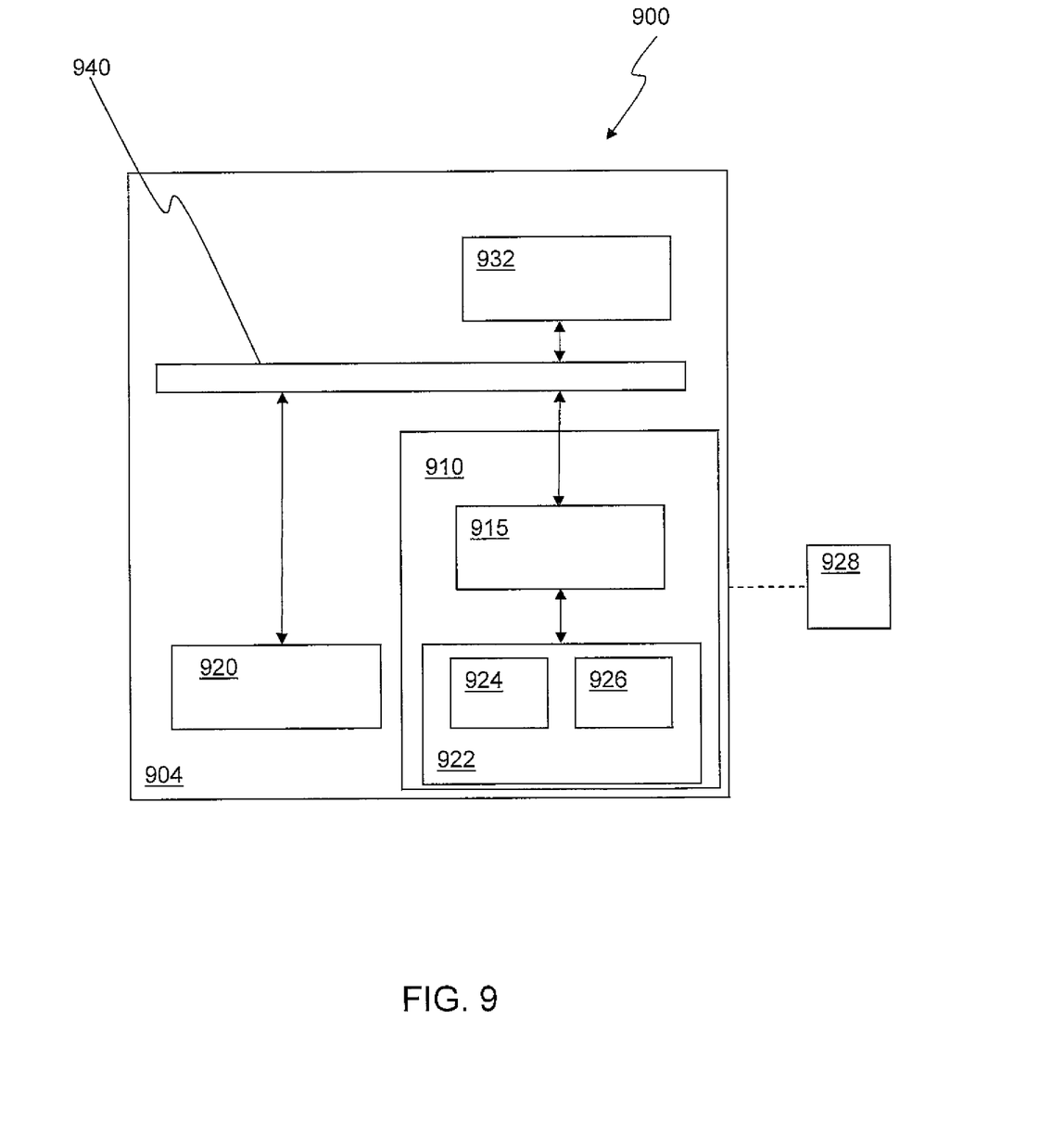
FIG. 9 is a schematic diagram illustrating an exemplary embodiment of a computing system.

FIG. 9 is a schematic diagram illustrating an exemplary embodiment of a computing system 900 including a memory device 910. Such a computing device may comprise one or more processors, for example, to execute an application and/or other code. Memory device 910 may comprise a memory that includes NAND block array 300, shown in FIG. 3. A computing device 904 may be representative of any device, appliance, or machine that may be configurable to manage memory device 910. Memory device 910 may include a memory controller 915 and a memory 922. By way of example but not limitation, computing device 904 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 900, and the processes and methods as further described herein, may be implemented using or otherwise including hardware, firmware, software, or any combination thereof. Thus, by way of example but not limitation, computing device 904 may include at least one processing unit 920 that is operatively coupled to memory 922 through a bus 940 and a host or memory controller 915. Processing unit 920 is representative of one or more circuits configurable to perform at least a portion of a data computing procedure or process. By way of example but not limitation, processing unit 920 may include one or more processors, controllers, microprocessors, microcontrollers, application specific integrated circuits, digital signal processors, programmable logic devices, field programmable gate arrays, and the like, or any combination thereof. Processing unit 920 may include an operating system configured to communicate with memory controller 915. Such an operating system may, for example, generate commands to be sent to memory controller 915 over bus 940. In one implementation, memory controller 915 may comprise an internal memory controller or an internal write state machine, wherein an external memory controller (not shown) may be external to memory device 910 and may act as an interface between the system processor and the memory itself, for example. Such commands may comprise read and/or write commands. In response to a write command, for example, memory controller 915 may provide a bias signal, such as bias signal 100 comprising a series of program pulses having individual peak amplitudes that sequentially increase from one pulse to the next, shown in FIG. 1, for example. In particular, memory controller 915 may maintain use-history information regarding memory array 922 in flag cells 926. Memory controller 915 may read the flag cells during a program-verify process to program data cells 924. Flag cells and data cells may share the same particular wordline, as shown in FIG. 3, for example. Memory controller 915 may modify parameters of a program-verify process based, at least in part, on read use-history information.

Memory array 922 is representative of any data storage mechanism. Memory array 922 may include, for example, a primary memory and/or a secondary memory. A primary memory may include, for example, a random access memory, read only memory, etc. While illustrated in this example as being separate from processing unit 920, it should be understood that all or part of memory array 922 may be provided within or otherwise co-located/coupled with processing unit 920. A secondary memory may include, for example, the same or similar type of memory as primary memory and/or one or more data storage devices or systems, such as, for example, a disk drive, an optical disc drive, a tape drive, a solid state memory drive, etc. In certain implementations, a secondary memory may be operatively receptive of, or otherwise configurable to couple to, a computer-readable medium 928. Computer-readable medium 928 may include, for example, any medium that can carry and/or make accessible data, code, and/or instructions for one or more of the devices in system 900.

Computing device 904 may include, for example, an input/output 932. Input/output 932 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 932 may include an operatively configured display, speaker, keyboard, mouse, trackball, touch screen, data port, etc.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method comprising:
   maintaining use-history information regarding a memory array in a first portion of memory cells in said memory array;
   reading said first portion of memory cells during a program-verify process to program a second portion of memory cells, wherein said first portion of memory cells and said second portion of memory cells are responsive to a particular wordline; and
   modifying parameters of said program-verify process based, at least in part, on read use-history information.

2. The method of claim 1, wherein said program-verify process comprises an incremental step pulse programming (ISPP) process, wherein a plurality of program pulses alternate with a plurality of verify processes.

3. The method of claim 2, wherein said parameters of said program-verify process comprise program pulse amplitude, program pulse width, program pulse slope, program pulse shape, and/or program pulse step size.

4. The method of claim 1, wherein said use-history information comprises a count of erase cycles experienced by said second portion of memory cells, a count of program-verify cycles experienced by said second portion of memory cells, a count of erase pulses in a last erase operation, or a duration of said last erase operation.

5. The method of claim 1, further comprising:
   updating said use-history information in response to a process of erasing said second portion of memory cells.

6. The method of claim 1, further comprising:
   programming said first portion of memory cells to a higher programming threshold voltage than that of said second portion of memory cells in a programmed state.

7. The method of claim 1, wherein said memory array comprises a NAND block array.

8. An apparatus comprising:
a controller to:
- store use-history information in a first portion of memory cells in a memory array, wherein said use-history information regards said memory array;
- read said first portion of memory cells during a program-verify process to program a second portion of memory cells, wherein said first portion of memory cells and said second portion of memory cells are responsive to a particular wordline; and
- modify said program-verify process based, at least in part, on read said use-history information.

9. The apparatus of claim 8, wherein said program-verify process comprises an incremental step pulse programming (ISPP) process.

10. The apparatus of claim 9, wherein modifying said program-verify process comprises modifying program pulse amplitude, program pulse width, and/or program pulse step size of said program-verify process.

11. The apparatus of claim 8, wherein said use-history information comprises a count of erase cycles experienced by said second portion of memory cells.

12. The apparatus of claim 8, said controller to update said use-history information in response to a process of erasing said second portion of memory cells.

13. The apparatus of claim 8, said controller to program said first portion of memory cells to a higher threshold voltage amplitude than that of said second portion of memory cells in a programmed state.

14. The apparatus of claim 8, wherein said memory array comprises a NAND array.

15. A system comprising:
a memory device comprising a memory array, said memory device further comprising a memory controller to:
- maintain use-history information regarding said memory array in a first portion of memory cells in said memory array;
- read said first portion of memory cells during a program-verify process to program a second portion of memory cells, wherein said first portion of memory cells and said second portion of memory cells are responsive to a particular wordline; and
- modify parameters of said program-verify process based, at least in part, on read said use-history information; and a processor to host one or more applications and to initiate a write command to said memory controller to program said second portion of memory cells in said memory array.

16. The system of claim 15, wherein said program-verify process comprises a plurality of program pulses that alternate with a plurality of verify processes.

17. The system of claim 16, wherein said parameters of said program-verify process comprise program pulse amplitude, program pulse width, or program pulse step size.

18. The system of claim 15, wherein said use-history information comprises a count of erase cycles experienced by said second portion of memory cells or a count of program-verify cycles experienced by said second portion of memory cells.

19. The system of claim 15, said controller to program said first portion of memory cells to a threshold voltage higher than that of said second portion of memory cells in a programmed state.

20. The system of claim 15, wherein said memory array comprises NAND memory cells.

21. The apparatus of claim 8, wherein modifying said program-verify process comprises modifying at least one of a program pulse width, a program pulse slope, a program pulse shape, and a program pulse step size of said program-verify process.

22. The apparatus of claim 8, wherein said use-history information comprises at least one of a count of program-verify cycles experienced by said second portion of memory cells, a count of erase pulses in a last erase operation, and a duration of said last erase operation.

* * * * *

UNITED STATES PATENT AND TRADEMARK OFFICE
CERTIFICATE OF CORRECTION

PATENT NO. : 8,451,662 B2
APPLICATION NO. : 13/040200
DATED : May 28, 2013
INVENTOR(S) : Angelo Visconti et al.

Page 1 of 1

It is certified that error appears in the above-identified patent and that said Letters Patent is hereby corrected as shown below:

On Title Page, Item (75), under "Inventors", column 1, line 3, delete "Barolomeo" and insert -- Bartolomeo --, therefor.

Signed and Sealed this
Twenty-third Day of July, 2013

Teresa Stanek Rea
*Acting Director of the United States Patent and Trademark Office*